United States Patent
Gopal et al.

(10) Patent No.: US 6,889,147 B2
(45) Date of Patent: May 3, 2005

(54) SYSTEM, COMPUTER PROGRAM PRODUCT AND METHOD FOR CONTROLLING A FUEL CELL TESTING DEVICE

(75) Inventors: Ravi Gopal, Oakville (CA); Didina Cazacu, North York (CA); Yuehui Wei, Scarborough (CA); Christoph Schuetz, Waterloo (CA)

(73) Assignee: Hydrogenics Corporation, Mississauga (CA)

( * ) Notice: Subject to any disclaimer, the term of this patent is extended or adjusted under 35 U.S.C. 154(b) by 55 days.

(21) Appl. No.: 10/244,609

(22) Filed: Sep. 17, 2002

(65) Prior Publication Data

US 2004/0054483 A1 Mar. 18, 2004

(51) Int. Cl.[7] .............................................. G06F 19/00
(52) U.S. Cl. ....................................................... 702/63
(58) Field of Search ................... 702/63, 113; 502/180, 502/89; 429/30, 309, 36, 26, 13, 22, 24, 23, 12, 42, 44; 307/18; 700/65; 436/139, 140

(56) References Cited

U.S. PATENT DOCUMENTS

| | | | |
|---|---|---|---|
| 5,896,494 A | 4/1999 | Perugini et al. |
| 5,916,705 A | 6/1999 | Carter et al. |
| 5,933,525 A | 8/1999 | Makhoul et al. |
| 5,944,784 A | 8/1999 | Simonoff et al. |
| 5,954,829 A | 9/1999 | McLain, Jr. et al. |
| 5,956,709 A | 9/1999 | Xue |
| 5,963,635 A | 10/1999 | Szlam et al. |
| 5,963,934 A | 10/1999 | Cochrane et al. |
| 5,969,715 A | 10/1999 | Dougherty et al. |
| 5,969,835 A | 10/1999 | Kamieniecki et al. |
| 5,978,594 A | 11/1999 | Bonnell et al. |
| 5,978,834 A | 11/1999 | Simonoff et al. |
| 5,980,090 A | 11/1999 | Royal, Jr. et al. |
| 5,987,251 A | 11/1999 | Crockett et al. |
| 5,991,897 A | 11/1999 | Perugini et al. |
| 6,002,868 A | 12/1999 | Jenkins et al. |
| 6,005,568 A | 12/1999 | Simonoff et al. |
| 6,006,035 A | 12/1999 | Nabahi |
| 6,014,517 A | 1/2000 | Shagam et al. |
| 6,030,718 A | 2/2000 | Fuglevand et al. |
| 6,035,119 A | 3/2000 | Massena et al. |
| 6,035,264 A | 3/2000 | Donaldson et al. |
| 6,061,727 A | 5/2000 | Simonoff et al. |
| 6,072,503 A | 6/2000 | Tani et al. |
| 6,072,944 A | 6/2000 | Robinson |
| 6,075,528 A | 6/2000 | Curtis |
| 6,078,321 A | 6/2000 | Simonoff et al. |
| 6,078,322 A | 6/2000 | Simonoff et al. |
| 6,078,743 A | 6/2000 | Apte et al. |
| 6,094,673 A | 7/2000 | Dilip et al. |
| 6,096,449 A | 8/2000 | Fuglevand et al. |
| 6,125,387 A | 9/2000 | Simonoff et al. |

(Continued)

FOREIGN PATENT DOCUMENTS

WO    WO 01/43216    6/2001

Primary Examiner—John Barlow
Assistant Examiner—Tung S Lau
(74) Attorney, Agent, or Firm—Bereskin & Parr

(57) ABSTRACT

During testing, a controllable condition of the fuel cell is controlled based on a control value, and a measurable condition of the fuel cell is measured to provide a data value. A data processor receives a user-readable input value and provides a user-readable output value. The user-readable input value is converted to the control value and the data value is converted to the user readable output value. A mapped file is generated by and is accessible by the data processor. The mapped file includes a plurality of tag records including a control tag record for storing the control value and a data tag record for storing the data value.

29 Claims, 6 Drawing Sheets

U.S. PATENT DOCUMENTS

| | | | |
|---|---|---|---|
| 6,129,895 A | 10/2000 | Edmondson | |
| 6,151,610 A | 11/2000 | Senn et al. | |
| 6,151,703 A | 11/2000 | Crelier | |
| 6,163,796 A | 12/2000 | Yokomizo | |
| 6,167,448 A | 12/2000 | Hemphill et al. | |
| 6,167,534 A | 12/2000 | Straathof et al. | |
| 6,173,437 B1 | 1/2001 | Polcyn | |
| 6,182,093 B1 | 1/2001 | Hagenaars | |
| 6,188,401 B1 | 2/2001 | Peyer | |
| 6,202,201 B1 | 3/2001 | Domi | |
| 6,218,035 B1 | 4/2001 | Fuglevand et al. | |
| 6,222,538 B1 | 4/2001 | Anderson | |
| 6,223,190 B1 | 4/2001 | Aihara et al. | |
| 6,224,746 B1 | 5/2001 | Meissner et al. | |
| 6,256,772 B1 | 7/2001 | Apte et al. | |
| 6,263,344 B1 | 7/2001 | Wu et al. | |
| 6,263,352 B1 | 7/2001 | Cohen | |
| 6,266,681 B1 | 7/2001 | Guthrie | |
| 6,461,751 B1 * | 10/2002 | Boehm et al. | 429/13 |

* cited by examiner

SYSTEM, COMPUTER PROGRAM PRODUCT AND METHOD FOR CONTROLLING A FUEL CELL TESTING DEVICE

FIELD OF THE INVENTION

This invention relates to fuel cell testing systems. More particularly, the invention relates to a system for controlling the operation of fuel cell testing systems and for automating fuel cell tests.

BACKGROUND OF THE INVENTION

In recent years, research and development of fuel cells has increased dramatically. It is expected that these efforts will eventually yield commercially viable power systems that produce little pollution.

Fuel cells convert chemical energy stored in fuels into electrical energy. A fuel cell has an anode and a cathode. In some types of fuel cell, hydrogen atoms are introduced into the anode. Within the fuel cell, the hydrogen atoms are separated into electrons and protons (hydrogen ions). The hydrogen ions pass through a membrane to the cathode, where they are combined with oxygen to form water. The electrons cannot flow through the membrane resulting in an electrical potential between the anode and cathode. The electrons flow through an external load to the cathode. Thus, the external load consumes the potential generated by the cell. At the cathode, the hydrogen ions are oxidized to produce water. Theoretically, the only products of the fuel cell are the electrical power consumed by the load, heat and water. In reality, impurities in the hydrogen fuel, environmental conditions and other conditions can substantially effect the efficiency of the fuel cell and resulting in by-products and exhaust products other than heat and water.

A typical fuel cell is capable of producing only a small electrical potential between its anode and cathode—generally about 1 volt. To produce a useful potential individual cells are assembled in series into fuel cell stacks. Typically, a test is conducted on such a fuel cell stack.

Fuel cell stacks must be tested under different and varied conditions to mirror the conditions in which they will be used in practical devices such as motor vehicles. This includes long term test during which conditions change. The development of fuel cells requires substantial testing and several testing systems or "test stations" have been developed for this purpose.

These testing stations allow many conditions of a fuel cell stack, its environment, fuel sources and other conditions to be controlled. Known testing stations allow these conditions to be controlled manually—a target value is set for each condition and automated equipment within the test station attempts to achieve the target value. For example, during a particular test, three target conditions relating to a hydrogen gas supply at the anode fuel supply for a fuel cell may be that it should be supplied at a pressure of 300 kPa, 83° C., and at a rate of 300 lpm (liters per minute). Typical fuel cell testing stations include pumps and flow controllers to achieve the desired pressure and flow rates and heating and/or cooling equipment to achieve the desired temperatures to control the flow rate. Similar characteristics of the cathode gas mixture, the load applied to the fuel cell and other conditions are similarly controllable.

Typically, fuel cell test stations have software control systems. It is preferable that the software has a simple and flexible architecture that allows the control system to be varied and configured easily.

Furthermore, it is desirable that the control system allows fuel cell stacks to be tested substantially automatically. In addition, the control system preferably allows the test or the control system itself to be modified easily—preferably even during a test through modification of the automated test and/or by manually changing the test conditions.

SUMMARY OF THE INVENTION

This invention provides a control system for monitoring and controlling the operation of a fuel cell testing system. The control system itself includes a server that incorporates a system manager and a set of driver applications. Each driver application communicates with a corresponding control module. The control modules in turn communicate with elements of the fuel cell testing system. Each such element may either be controlled or monitored or both by the control module to which it is coupled. For example, flow control elements may be monitored to determine the amount of liquid or gas that is currently flowing through them, and may also be controlled to set the amount of liquid or gas that it will pump.

The driver applications are created and launched by the system manager and they communicate with the system manager through a mapped file created and made available by the system manager. The mapped file contains a record for every controllable or monitorable element in the fuel cell testing system. Elements that are both controllable and monitorable are treated as having separate controllable and monitorable characteristics and each such characteristic has a separate record in the mapped file.

The record for each controllable or monitorable characteristic of an element is identified in the mapped file with a unique tag name. Tags that are associated with a controllable element are referred to as control tags. Tags that are associated with a monitorable element are referred to as data tags.

Tags may be associated by various signal types depending on the nature of the device being controlled or monitored. For example, a valve or switch that may be simply closed or open receives a digital control value to either turn it on or off. The valve or switch can also be queried to determine a digital data value to determine if it is open or closed. The switch has a control tag that is used to transmit the digital control value and has a data tag that is used to query its current state.

In contrast, a flow controller which can be set to allow different controllable amounts of liquid or gas to flow through it will typically receive an analog control value, which defines the amount of gas or liquid that should flow through it. Correspondingly, a flow controller can be queried to determine an analog data value which indicates the amount of liquid or gas that is presently flowing through it. In an alternative embodiment of the present invention a device such as a flow controller having many settings may also receive a digital value consisting of more than one bit that defines a particular setting from the group of settings. For example, an eight bit word may be sent as a control value to instruct the full controller to allow the better gas to flow out one of 256 levels.

Coupled to the system manager is at least one user application that is not part of the first embodiment of the present invention but may be prepared by a user in order to control the operation and procedures of a fuel cell test. The system manager communicates with the driver applications and the one or more user applications through a mapped file. The system manager creates the mapped file and makes it accessible to each driver application and each user application. The mapped file contains tag records and also some system activity info, such as task activity flags that allow the system manager to control the activity of the entire testing system.

Driver applications read the control values of the specific tags and record the present control values. Typically a control module will use a different range of signals to control a physical device then the numerical operating range of that device. For example, a control system may be configured to transmit a signal between 0 to 20 volts to operate a flow controller that is capable of flowing between 0 and 500 standard liters per minute (slpm). The relationship between the 0 and 20 volt input control value range and the 0 and 500 slpm operating level range may or may not be linear. In one embodiment described below it is assumed that the relationship between the ranges is linear. In another embodiment the range may be non linear and the record for the tag in the mapped file may contain either a look-up table or formula or both, which may be used to convert between one range and the other. The record for each tag file contains eight fields to record both the control or data value (depending on whether the tag is a control tag or a data tag) and the current operating level for the tag (which may be a desired operating level for a control tag or an actual operating level for a data tag). The user applications use operating values, which are understood by the humans that will typically use user applications to interact with the fuel cell testing system and the control system of the present invention. User applications use a collection of reading/writing methods (MappedFilesTool.dll) to write or read data in/from the tag file. These reading/writing methods ensure the data converting according to the signal description in each tag.

An object of one aspect of the present invention is to provide an improved fuel cell testing system.

In accordance with a first aspect of the present invention, there is provided a system for testing a fuel cell. The system comprises(a) testing means for controlling a controllable condition of the fuel cell during testing based on a control value, and for measuring a measurable condition of the fuel cell during testing to provide a data value; (b) a control system for sending the control value to the testing means and for receiving the data value from the testing means; (c) a system manager for sending the control value to the control system, and for receiving the data value from the control system, the system manager being connected to the control system and comprising (i) user interface means for receiving a user-readable input value and for providing a user-readable output value, (ii) conversion means for converting the user-readable input value to the control value and for converting the data value to the user-readable output value, and, (iii) mapped file generation means for generating a mapped file, wherein the mapped file comprises a plurality of tag records, the plurality of tag records including a control tag record for storing the control value and a data tag record for storing the data value; and, (d) a storage means for storing the mapped file.

An object of a second aspect of the present invention is to provide an improved method for testing fuel cells.

In accordance with a second aspect of the present invention, there is provided a method, in a data processor, for controlling a plurality of controllable conditions of a fuel cell and for measuring a plurality of measurable conditions of the fuel cell. The method comprises (a) entering a user-readable input value into the data processor; (b) converting the user-readable input value to an associated control value; (c) controlling an associated controllable condition based on the associated control value for the user-readable input value; (d) measuring a selected measurable condition in the plurality of measurable conditions to obtain an associated data value; (e) converting the associated data value to a user-readable output value; and, (f) displaying the user-readable output value.

An object of a third aspect of the present invention is to provide a computer program product for configuring a data processor of a fuel cell testing system to provide an improved method for testing fuel cells.

In accordance with a third aspect of the present invention, there is provided a computer program product for use on a fuel cell testing system including a data processor to control a plurality of controllable conditions of a fuel cell and to measure a plurality of measurable conditions of the fuel cell. The computer program product comprises a recording medium; means recorded on the medium for instructing the data processor to perform the steps of: (a) converting a user-readable input value to an associated control value; (b) controlling an associated controllable condition based on the associated control value for the user-readable input value; (c) measuring a selected measurable condition in the plurality of measurable conditions to obtain an associated data value; (d) converting the associated data value to a user-readable output value; and, (e) displaying the user-readable output value.

BRIEF DESCRIPTION OF THE DRAWINGS

A preferred embodiment of the present invention will now be described in detail with reference to the drawings, in which.

DETAILED DESCRIPTION OF EXEMPLARY EMBODIMENT

Intro to Fuel Cell Testing Systems

Figure 1:
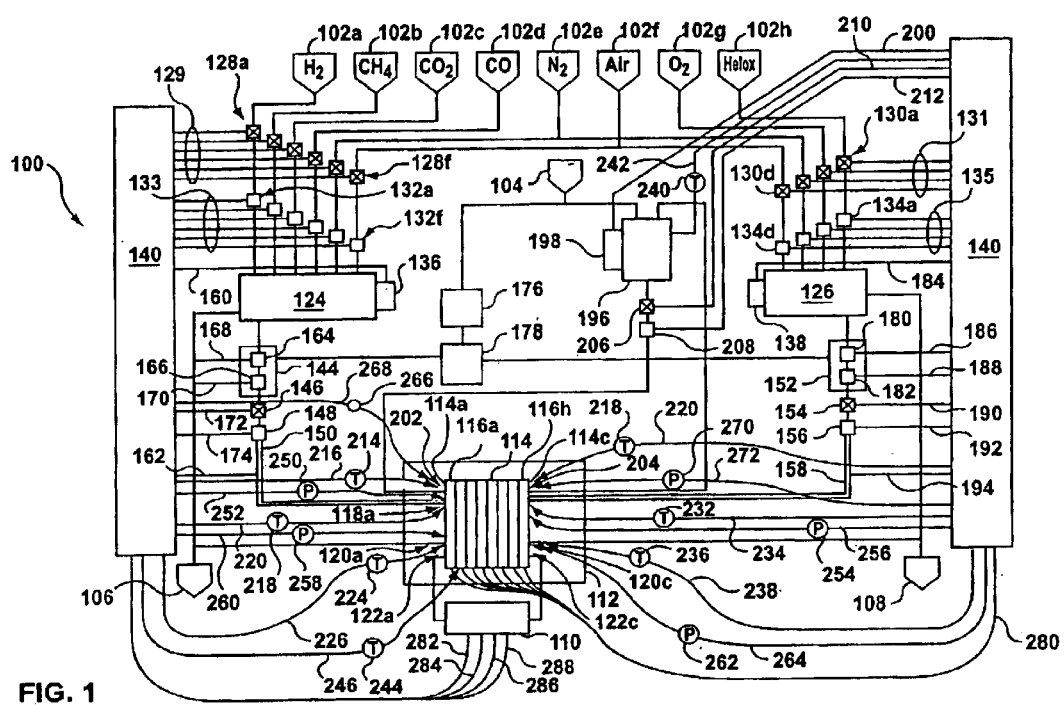
FIG. 1 is a schematic illustration of an exemplary fuel cell stack testing system including a control system according to the present invention.

Reference is first made to FIG. 1, which schematically illustrates an exemplary fuel cell stack testing system 100. System 100 has a series of gas inlets 102a, 102b, 102c, . . . , 102g, a de-ionized water input 104, a combustible exhaust outlet 106, a non-combustible exhaust outlet 108, a controllable loadbox 110, a test chamber 112 and a control system 140. Control system 140 is schematically illustrated at several places on FIG. 1 to simplify the Figure.

This exemplary fuel cell testing system 100 is configured for testing hydrogen based fuel cell stacks. When system 100 is in use, a fuel cell stack 114 is usually positioned in test chamber 112. Fuel cell stack 114 has an anode side 114A and a cathode side 114C. The anode side 114A of stack 114 has an anode gas inlet 118A, an anode gas exhaust outlet 120A and an anode electrical terminal 122A. The cathode side 114C has a cathode gas inlet 118C, a cathode gas exhaust outlet 120C and a cathode electrical terminal 122C.

A hydrogen based fuel cell stack typically consists of a stack of individual fuel cells. Stack 114 comprises 8 fuel cells 116a–116h. Each of the fuel cells 116 has an anode side and a cathode side, which are separated by a membrane. (The internal structure of each cell 116 is not shown, but will be well understood by those skilled in the art.) The anode side of each fuel cell is coupled to the anode gas inlet 118A to receive an anode gas mixture. The anode gas mixture includes hydrogen. The cathode side of each fuel cell 116 is coupled to the cathode gas inlet 118C to receive a cathode gas mixture. The cathode gas mixture contains an oxidant. In this exemplary embodiment, the oxidant is oxygen. In this way, hydrogen is supplied to the anode side of each fuel cell 116 and oxygen is supplied to the cathode side. Hydrogen molecules (H2) are separated on the anode side into electrons and hydrogen ions (H+). The hydrogen ions flow across a membrane to the cathode side of the fuel cell 116. The membrane is impermeable to the electrons. Free electrons are collected at an anode current collector. Each cell 116 also has a cathode current collector. The collection of electrons at the anode current collector creates an electrical potential across the fuel cell 116. The fuel cells 116 are electrically arranged in series within the stack 114 so that the combined potential of the fuel cell 116 appears between the anode electrical terminal 122A and the cathode electrical terminal 122C. The electrons freed in each fuel cell 116 flow from the anode electrical terminal 122A through loadbox 110 back to cathode electrical terminal 122C. From the cathode electrical terminals, the free electrons flow to the cathode side of the individual fuel cell 116, where the hydrogen ions, electrons and oxygen combine to form water. The flow of electrons is a current which can perform work in the loadbox 110.

Ideally, stack 114 would receive only hydrogen gas on its anode side and oxygen on its cathode side. However, these ideal conditions are unlikely to be met during the practical usage of a stack. Accordingly, system 100 is configured to provide anode and cathode gas mixtures with controllable compositions. Selected gas inlets 102 are coupled to an anode gas mixture manifold 124 through a series of gas valves 128 and flow controllers 132. Similarly, selected gas inlets 102 are coupled to a cathode gas mixture manifold 126 through a series of gas valves 130 and flow controllers 134. In this exemplary embodiment, the hydrogen, methane, carbon monoxide, carbon dioxide, nitrogen and air supplies (which correspond to gas inlets 102a–102e) are coupled to the anode gas mixture manifold 124 through valves 128a–f and flow controllers 132a–f. The nitrogen, air, oxygen and helox supplies (which correspond to gas inlets 102d–102h) are coupled to the cathode gas mixture manifold 126 through valves 130a–d and flow controller 134a–d.

Gas supply valves 128a–f are controlled by a control system 140 through control lines 129a–f. Gas supply valves 130a–d are controlled by control system 140 through control lines 131a–d. Flow controllers 132a–f are controlled by control system 140 through data/control lines 133a–f. Flow controllers 134a–d are controlled by control system 140 through data/control lines 135a–d. Control system 140 operates valves 128 and flow controllers 132 so that the mixture of gases in anode gas mixture manifold 124 (the "anode gas mixture") has a selected composition. Similarly control system 140 operates valves 130 and flow controllers 134 to ensure that a cathode gas mixture in cathode gas mixture manifold 126 has a desired composition.

Typically, it is desirable to control the temperature and humidity level of the anode gas mixture and the cathode gas mixture as they are supplied to the stack 114 during a test.

An anode gas heater 136 is coupled to anode gas mixture manifold 124 to monitor the temperature of the anode gas mixture and to heat or cool the anode gas mixture stored in anode gas mixture manifold 124 to a desired temperature. Similarly a cathode gas heater 138 is coupled to cathode gas mixture manifold 126 to monitor the temperature of the cathode gas mixture and to heat or cool the cathode gas mixture to a desired temperature. Anode gas heater 136 is coupled to control system 140 through a data/control line 160, through which control system 140 can monitor the temperature of the anode gas mixture, as well as control the operation of anode gas heater 136.

From anode gas mixture manifold 124, the anode gas mixture passes through an anode gas humidity control unit 144, an anode gas mixture valve 146 and a flow controller 148. From flow controller 148, the anode gas mixture flows into the anode gas inlet 118 of stack 114 through an anode gas reheating jacket 150. From cathode gas mixture manifold 126, the cathode gas mixture flows through a cathode gas humidity control unit 152, a cathode gas mixture valve 156 and a flow controller 156. From flow controller 156, the cathode gas mixture flows through a cathode gas reheating jacket 158 into the cathode gas inlet 118C. The operation of anode gas mixture valve 146 is controlled by control system 140 through control line 172. The operation of anode gas flow controller 148 is controlled by control system 140 through data/control line 174.

During the operation of the system 100, some of the anode gas mixture produced in anode gas mixture manifold 124 is not pumped to stack 114. The excess anode gas mixture is discarded through combustible exhaust outlet 106.

Anode gas heater 136 heats the anode gas mixture to the temperature at which it should be supplied to the stack 114. Reheating jacket 150 ensures that the temperature of the anode gas mixture does not change as the anode gas mixture flows into the stack 114. The operation of anode gas heater 136 (i.e. the temperature to which it heats the anode gas mixture) is controlled by control system 140 through data/control line 160. Similarly, the operation of anode reheating jacket 150 is controlled by control system 140 through control line 162.

System 100 receives a de-ionized water supply at de-ionized water inlet 104. A boiler 176 receives de-ionized water and boils it to produce steam, which is stored in a steam reservoir 178.

Anode humidity control unit 144 receives steam from steam reservoir 178. Anode humidity control unit 144 includes a saturator 164 and a dewpoint controller 162. The anode gas mixture first flows through saturator 164, which is controlled by control system 140 through a data/control line 168. Saturator 164 is typically operated to heat anode gas mixture sufficiently that it becomes completely saturated with water vapour (i.e. it has 100% humidity). From saturator 164, the anode gas mixture flows into dewpoint controller 166, which is controlled by control system 140 via data/control line 170. Dewpoint controller 166 is operated to reduce to the temperature of the anode gas mixture so that the humidity level of the anode gas mixture falls to a desired level. It is not necessary that saturator 164 be operated to completely saturate the anode gas mixture. It is sufficient to heat the anode gas mixture so that its humidity level is at or above the desired humidity level.

The anode gas mixture flows through reheating jacket 150 into an anode gas mixture inlet 118A of stack 114. Some of the anode gas mixture supplied to stack 140 will not be consumed by the anode side of fuel cells 116 and the unused portion of the anode gas mixture is exhausted through anode gas mixture exhaust outlet 120A. From anode gas mixture exhaust outlet 120A, the unused anode gas mixture flows to combustible exhaust outlet 106.

The cathode gas mixture produced in cathode gas mixture manifold 126 is similarly humidified by cathode humidity control unit 152, which has a cathode gas saturator 180 and dewpoint controller 182. The temperature of the cathode gas mixture is controlled by cathode gas heater 138 and cathode reheating jacket 158. The humidification and flow of the cathode gas mixture is controlled by control system 140 through the data/control lines listed in Table 1.

TABLE 1

Data/Control lines for cathode gas related elements

| Element | Data/control line used by control system 140 to monitor and/or control element |
|---|---|
| Cathode gas heater 138 | Data/control line 184 |
| Cathode gas saturator 180 | Data/control line 186 |
| Cathode dewpoint controller 182 | Data/control line 188 |
| dewpoint controller 154 | Data/control line 190 |

TABLE 1-continued

Data/Control lines for cathode gas related elements

| Element | Data/control line used by control system 140 to monitor and/or control element |
|---|---|
| Cathode gas flow controller 156 | Data/control line 192 |
| Cathode reheating jacket 158 | Data/control line 194 |

Excess cathode gas mixture that is not pumped to the cathode gas inlet 118C or which is unused and exhausted through cathode gas exhaust outlet 120C is exhausted from system 100 through non-combustible exhaust outlet 108.

During use, stack 114 is typically cooled. De-ionized water from de-ionized water inlet 104 flows into a stack coolant reservoir 196, which has an attached stack coolant cooler 198. Cooler 198 cools the de-ionized water stored in reservoir 196 to a desired temperature. The operation of cooler 198 is controlled by control system 140 through data/control line 200. Cooled de-ionized water flows from reservoir 196 to stack coolant inlet 202, through the stack, stack coolant outlet 204 and back to reservoir 196, under the control of coolant valve 206 and coolant flow controller 208. Coolant valve 206 and coolant flow controller 208 are controlled by control system 140 through data/control lines 210 and 212.

During a test of fuel cell stack 114, it is generally desirable to measure the temperature at various point of system 100 and stack 114. Control system 140 includes thermometers coupled to the points of system 100 and stack 114 listed in Table 2, for measuring the temperature at the indicated points. These thermometers are represented on FIG. 1 by a capital "T" in a circle with an arrow pointing towards the location at which the thermometer takes a measurement. Each of these thermometers is coupled to control system 140, through the data line indicated in Table 2.

TABLE 2

Thermometers coupled to system 100

| Thermometer Element No. | Location on FIG. 1 | Temperature characteristic measured | Data line coupling thermometer to control system 140 |
|---|---|---|---|
| 214 | Stack coolant inlet 202 | Temperature of stack coolant entering stack 114 | 216 |
| 218 | Stack coolant outlet 204 | Temperature of stack coolant existing stack 114 | 220 |
| 224 | Anode gas inlet 118A | Temperature of anode gas mixture entering stack 114 | 226 |
| 228 | Anode gas outlet 120A | Temperature of unused anode gas mixture exiting stack 114 | 230 |
| 232 | Cathode gas inlet 118C | Temperature of cathode gas mixture entering stack 114 | 234 |
| 236 | Anode gas outlet 120C | Temperature of unused cathode gas mixture exiting stack 114 | 238 |
| 240 | Stack coolant reservoir 196 | Temperature of stack coolant in reservoir | 242 |
| 244 | Selected point on stack 114 (may be moved to various points on stack) | Temperature of stack 114 at selected point | 246 |

It is also generally desirable to measure the pressure of the various gases and fluids in system 100 during a test of a fuel cell. Control system 100 includes various pressure sensors coupled to different parts of system 100. Table 3 identifies these pressure sensors and their position in system 100. These pressure sensors are represented on FIG. 1 by a capital "P" in a circle with an arrow pointing towards the location at which the pressure sensor is located and the pressure that it measures. Each of these thermometers is coupled to control system 140, through the data line indicated in Table 3.

TABLE 3

Pressure sensors coupled to system 100

| Pressure Sensor Element No. | Location on FIG. 1 | Pressure characteristic measured | Data line coupling pressure sensor to control system 140 |
|---|---|---|---|
| 250 | Anode gas mixture inlet 118A | Anode gas mixture pressure at inlet to stack 114 | 252 |
| 254 | Cathode gas mixture inlet 118C | Cathode gas mixture pressure at inlet to stack 114 | 256 |
| 258 | Anode gas mixture outlet 120A | Anode gas mixture pressure at outlet from stack 114 | 260 |
| 262 | Cathode gas mixture outlet 120C | Cathode gas mixture at outlet from stack 114 | 264 |
| 266 | Stack coolant inlet 202 | Stack coolant pressure at inlet to stack 114 | 268 |
| 270 | Stack coolant outlet 204 | Stack coolant pressure at outlet from stack 114 | 272 |

One important characteristic of stack performance that is usually measured during a test of a fuel cell stack is the voltage generated between the anode and cathode of each cell in the stack. A set of data lines 280 are coupled between cells 116 and control system 140 to measure the voltage across each cell 116 and to provide the measured voltages to control system 140. A skilled person will recognize that the voltage across a cell 116 will require measurement of the potentials on both sides of the cell 116. Accordingly, each data line 280 may be coupled to a pair of electrodes that are coupled across the cell 116 and a circuit for calculating the voltage difference across the electrodes (such as a differential amplifier) may be used to calculate the voltage value reported to control system 140.

Loadbox 110 is capable of drawing a controlled load from stack 114. The following components of the load drawn by loadbox 110 are configurable: DC power (effectively a current drawn at the power across the stack electrical terminals 122), AC frequency, AC voltage and AC current. Typically, loadbox 110 will be capable of adding any type of AC component into the load on the stack 114. A set of control lines 282–288 are coupled between the loadbox 110 and control system 140 to allow control system 140 to control the different characteristics of the load drawn from stack 114 to be controlled. Control lines 282–288 are described in Table 4.

TABLE 4

Control Lines for Loadbox 110

| Control Line | Characteristic of load controlled |
|---|---|
| 282 | DC power |
| 284 | AC current |
| 286 | AC voltage |
| 288 | AC current |

Figure 2:
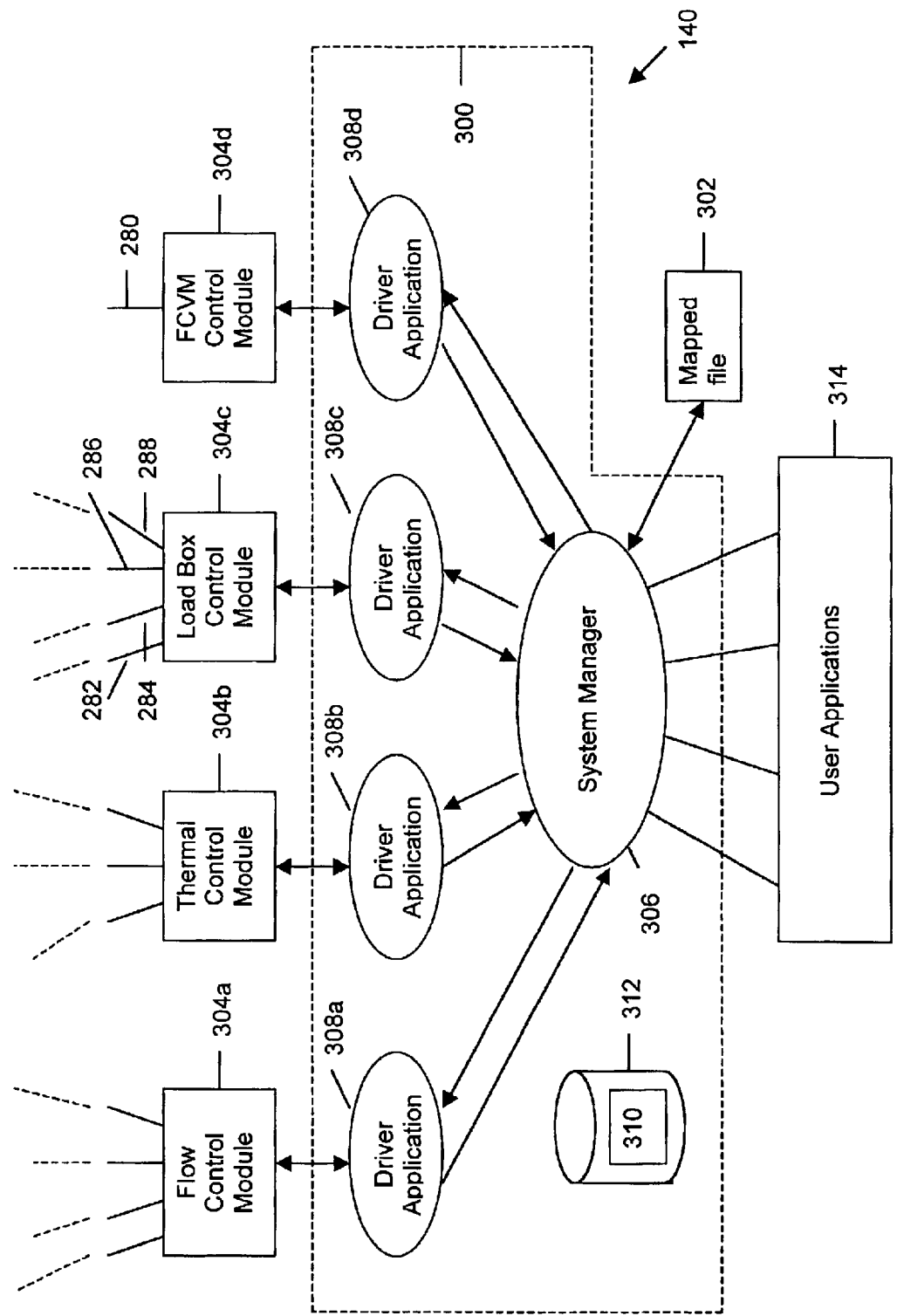
FIG. 2 illustrates the control system of FIG. 1.

Reference is next made to FIG. 2, which illustrates control system 140, according to a first embodiment of the present invention. Control system 140 includes a server 300, a mapped file 302 and a set of control modules 304a, 304b, 304c, 304d. Server 300 includes a system manager 306 and a set of driver applications 308a, 308b, 308c, 308d.

Control modules 304 are coupled to elements of system 100 (FIG. 1) through the various data/control lines described above. Each of control modules 304 interfaces with different parts of system 100. In this embodiment, control module 304a is a flow control module and, in general, is coupled to valves and flow controllers in system 100. Control module 304b is a thermal control module that is, in general, coupled to thermometers, heaters and coolers in system 100. Control module 304c is a loadbox control module that is, in general, coupled to control lines 282–288 to control the operation of loadbox 110. Control module 304d is a Fuel Cell Voltage Monitoring (FCVM) control module that is coupled to the control lines 280, which monitor the voltage across fuel cell 116 in stack 114. Each control module 304 is coupled to system manager 306 through a corresponding driver application 308.

Communications between each control module 304 and its corresponding driver application will be carried out using a selected communications protocol. For example, protocols such as RS232, RS485, IEEE488 or any other serial or parallel data communication protocol may be used. The selection of the protocol will typically depend on the nature of the devices included in the control module.

In this embodiment, communications between each driver application 308 and the system manager 306 are accomplished using a pair of message queues. To communicate with system manager 306, driver application 308a stores messages in a shared memory. System manager 306 subsequently retrieves the messages from the shared memory and acts on them. To communicate with driver application 308a, system manager 306 stores messages in the shared memory. Driver application 308a subsequently retrieves and acts on the messages. Driver applications 308b–d similarly use the shared memory to communicate with system manager 306. In other embodiments, communication between the driver applications 308 and system manager 306 may be performed using any known mechanism, such as message queues or another communication techniques.

Table 5 describes the following characteristics of each of the data/control lines coupled to system 100:

TABLE 5

Data/Control lines and associated tag information

| Field in Table 5 | Description |
|---|---|
| Data/Control Line | The reference numeral used to identify the data/control line in this patent. |
| Element | The reference numeral used to identify the element of system 100 that is monitored or controlled or both using the identified data/control line. |

TABLE 5-continued

Data/Control lines and associated tag information

| | |
|---|---|
| Tag name | A unique reference name for the specific characteristic controlled. |
| Signal Type | The type of communication signal transmitted across the data/control line. A digital signal is typically used to switch a device on or off. An analog signal is used for devices that can be set at multiple levels, or at any level between some low and high limits.<br>A digital value signal is used to transmit a digital word encoding a control or data level. For example, an 8 bit digital word may be used to encode a digital value signal that may have up to 256 levels.<br>An output signal is used to control a device - the device is set to operate at the specified controlled level by sending a signal through the associated control line. Tags relating to an output signal are referred to as "control tags".<br>An input signal is used to monitor a device - the current operational level of the device is reported through the data line. Tags relating to an input signal are referred to as "data tags".<br>Some data/control lines are data lines only. Such data lines are used to monitor an element of system 100. Other data/control lines are control lines only. These control lines are used only to control an element of system 100. Other data/control lines operate bi-directionally and allow both data and control signals to be transmitted. These bi-directional data/control lines may consist of a single physical line or may consist of multiple physical lines which separately carry the data and control communications. |
| Module | The name of the control module to which the data/control line is connected. |
| Tag # | A unique tag number that allows the tag to be identified. |
| Control/Data Range Low | Used for analog inputs and outputs. Defines the lowest control or data signal level use by the associated control module to communicate with a device (for the specified tag). For example, flow control module 304a transmits an analog signal to flow controller 134a, which controls the flow of helox gas into the cathode gas mixture manifold 126, using data/control line 135a. The analog signal has a range between 0 to 20. The units of this range will depend on the interface used by the associated flow control device 304. For example, a signal of between 0 to 20 volts may be used. Alternatively, a signal of between 0 to 20 milliamps might be used. The present invention is not limited to the use of any particular control interface between a device and the associated control module. |
| Control/Data Range High | Used for analog inputs and outputs. Defines the highest control or data signal level use by the associated control module to communicate with a device. |
| Device Operating Range Low | Used for analog inputs and outputs. Defines the lowest operational level for an element of system 100. A device will typically receive control signals or transmit data signal within its control/data range that correlate to its operational range. Typically, the two ranges will be different. For example, flow controller 134a receives control signals ranging between 0 and 20. However, it is capable of pumping between 0 to 500 standard liters per minute (see Units field) of helox into the cathode gas mixture manifold. In this embodiment, the relationship between the control range and the operational range is assumed to be linear. In other embodiments, the relationship may be non-linear and may be different for different devices. The tag file may be modified to include co-efficients defining a non-linear relationship between the control/data range and the operating range. Such co-efficients may define an algebraic conversion, a lookup table or a combination of these and possibly other mechanisms for converting between the control/data range and the operational range. |
| Device Operating Range High | Used for analog inputs and outputs. Defines the highest operational level of an element of system 100. |
| Units | The name of the unit in which the operational range of the device is defined. |

TABLE 5-continued

Data/Control lines and associated tag information

| Data/Control Line | Element | Tag name | Signal Type | Module | Tag# | Control Range Low | Control Range High | Device Range Low | Device Range High | Units |
|---|---|---|---|---|---|---|---|---|---|---|
| 129a | 128a | Valve_anode_mix_H2 | Digital output | Flow Control | 661 | — | — | — | — | — |
| 129b | 128b | valve_anode_mix_ch4 | Digital output | Flow control | 666 | — | — | — | — | — |
| 129c | 128c | valve_anode_mix_co2 | Digital output | Flow control | 663 | — | — | — | — | — |
| 129d | 128d | valve_anode_mix_co | Digital output | Flow control | 664 | — | — | — | — | — |
| 129e | 128e | valve_anode_mix_N2 | Digital output | Flow control | 662 | — | — | — | — | — |
| 129f | 128f | valve_anode_mix_air | Digital output | Flow control | 665 | — | — | — | — | — |
| 131a | 130a | valve_cathode_mix_helox | Digital output | Flow control | 680 | — | — | — | — | — |
| 131b | 130b | valve_cathode_mix_o2 | Digital output | Flow control | 677 | — | — | — | — | — |
| 131c | 130c | valve_cathode_mix_air | Digital output | Flow control | 676 | — | — | — | — | — |
| 131d | 130d | valve_cathode_mix_N2 | Digital output | Flow control | 678 | — | — | — | — | — |
| 133a | 132a | flow_anode_mix_N2 | Analog Input | Flow control | 576 | 0 | 20 | 0 | 300 | Slpm |
|  |  | flow_anode_mix_h2_set | Analog output | Flow control | 577 | 0 | 20 | 0 | 300 | Slpm |
| 133b | 132b | flow_anode_mix_ch4 | Analog Input | Flow control | 586 | 0 | 20 | 0 | 50 | Slpm |
|  |  | flow_anode_mix_ch4_set | Analog output | Flow control | 587 | 0 | 20 | 0 | 50 | Slpm |
| 133c | 132c | flow_anode_mix_co2 | Analog Input | Flow control | 580 | 0 | 20 | 0 | 300 | Slpm |
|  |  | flow_anode_mix_co2_set | Analog output | Flow control | 581 | 0 | 20 | 0 | 300 | Slpm |
| 133d | 132d | flow_anode_mix_co | Analog Input | Flow control | 582 | 0 | 20 | 0 | 1000 | Slpm |
|  |  | flow_anode_mix_co_set | Analog output | Flow control | 583 | 0 | 20 | 0 | 1000 | Slpm |
| 133e | 132e | flow_anode_mix_N2 | Analog Input | Flow control | 578 | 0 | 20 | 0 | 500 | Slpm |
|  |  | flow_anode_mix_n2_set | Analog output | Flow control | 579 | 0 | 20 | 0 | 500 | Slpm |
| 133f | 132f | flow_anode_mix_air | Analog Input | Flow control | 584 | 0 | 20 | 0 | 50 | Slpm |
|  |  | flow_anode_mix_air_set | Analog output | Flow control | 585 | 0 | 20 | 0 | 50 | Slpm |
| 135a | 134a | flow_cathode_mix_helox | Analog Input | Flow control | 614 | 0 | 20 | 0 | 500 | slpm |
|  |  | flow_cathode_mix_helox_set | Analog output | Flow control | 615 | 0 | 20 | 0 | 500 | slpm |
| 135b | 134b | flow_cathode_mix_o2 | Analog Input | Flow control | 608 | 0 | 20 | 0 | 50 | slpm |
|  |  | flow_cathode_mix_o2_set | Analog output | Flow control | 609 | 0 | 20 | 0 | 50 | slpm |
| 135c | 134c | flow_cathode_mix_air | Analog Input | Flow control | 606 | 0 | 20 | 0 | 50 | slpm |
|  |  | flow_cathode_mix_air_set | Analog output | Flow control | 607 | 0 | 20 | 0 | 50 | slpm |
| 135d | 134d | flow_cathode_mix_N2 | Analog Input | Flow control | 610 | 0 | 20 | 0 | 500 | slpm |
|  |  | flow_cathode_mix_n2_set | Analog output | Flow control | 611 | 0 | 20 | 0 | 500 | slpm |
| 170 | 166 | signal_out_anode_dewpt_loop | Digital output | Flow control | 747 | — | — | — | — | — |
| 168 | 164 | temp_anode_sat | Analog Input | Thermal control | 512 | 0 | 1000 | 0 | 100 | ° C. |
|  |  | temp_anode_sat_set | Analog output | Thermal control | 513 | 0 | 1000 | 0 | 100 | ° C. |
| 170 | 166 | temp_anode_dewpt | Analog Input | Thermal control | 516 | 0 | 1000 | 0 | 100 | ° C. |
|  |  | temp_anode_dewpt_set | Analog output | Thermal control | 517 | 0 | 1000 | 0 | 100 | ° C. |
| 131 | 130 | valve_anode_stack | Digital output | Flow control | 692 | — | — | — | — | — |
| 174 | 148 | flow_anode_stack | Analog Input | Flow control | 638 | 0 | 20 | 0 | 11 | slpm |
|  |  | flow_anode_stack_set | Analog output | Flow control | 639 | 0 | 20 | 0 | 11 | slpm |
| 162 | 150 | signal_out_anode_reheat_loop | Digital output | Flow control | 748 | — | — | — | — | — |
| 162 | 150 | temp_anode_reheat | Analog Input | Thermal control | 520 | 0 | 1000 | 0 | 100 | ° C. |
|  |  | temp_anode_reheat_set | Analog output | Thermal control | 521 | 0 | 1000 | 0 | 100 | ° C. |
| 216 | 214 | temp_anode_inlet | Analog Input | Thermal control | 524 | 0 | 1000 | 0 | 100 | ° C. |
|  |  | temp_anode_inlet_set | Analog output | Thermal control | 525 | 0 | 1000 | 0 | 100 | ° C. |
| 188 | 182 | signal_out_cathode_dewpt_loop | Digital output | Flow control | 749 | — | — | — | — | — |
| 226 | 224 | temp_anode_out | Analog output | Flow control | 542 | 0 | 0 | 0 | 0 | ° C. |
| 192 | 156 | signal_out_cathode_reheat_loop | Digital output | Flow control | 750 | — | — | — | — | — |
| 188 | 182 | temp_cathode_dewpt | Analog Input | Thermal control | 518 | 0 | 1000 | 0 | 100 | ° C. |
|  |  | temp_cathode_dewpt_set | Analog output | Thermal control | 519 | 0 | 1000 | 0 | 100 | ° C. |
| 186 | 180 | temp_cathode_sat | Analog Input | Thermal control | 514 | 0 | 1000 | 0 | 100 | ° C. |
|  |  | temp_cathode_sat_set | Analog output | Thermal control | 515 | 0 | 1000 | 0 | 100 | ° C. |
| 194 | 158 | temp_cathode_reheat | Analog Input | Thermal control | 522 | 0 | 1000 | 0 | 100 | ° C. |
|  |  | temp_cathode_reheat_set | Analog output | Thermal control | 523 | 0 | 1000 | 0 | 100 | ° C. |
| 242 | 240 | temp_coolant_tank_out | Analog Input | Thermal control | 528 | 0 | 1000 | 0 | 100 | ° C. |
|  |  | temp_coolant_tank_out_set | Analog output | Thermal control | 529 | 0 | 1000 | 0 | 100 | ° C. |
| 190 | 154 | valve_cathode_stack_1 | Digital output | Flow control | 697 | — | — | — | — | — |
| 252 | 250 | pressure_anode_in | Analog Input | Flow control | 806 | 1 | 5 | 0 | 350 | kPa |
|  |  | pressure_anode_in_set | Analog output | Flow control | 807 | 4 | 20 | 0 | 350 | kPa |

TABLE 5-continued

Data/Control lines and associated tag information

| | | | | | | | | | | | |
|---|---|---|---|---|---|---|---|---|---|---|---|
| 256 | 254 | pressure_cathode_in | Analog Input | Flow control | 808 | 1 | 5 | 0 | 350 | kPa |
| | | pressure_cathode_in_set | Analog output | Flow control | 809 | 4 | 20 | 0 | 350 | kPa |
| 260 | 258 | pressure_anode_diff | Analog Input | Flow control | 810 | 0 | 5 | 0 | 35 | KPa |
| 264 | 262 | pressure_cathode_diff | Analog Input | Flow control | 811 | 0 | 5 | 0 | 35 | KPa |
| 268 | 266 | pressure_coolant | Analog Input | Flow control | 812 | 4 | 20 | 0 | 550 | KPa |
| | | pressure_coolant_set | Analog output | Flow control | 813 | 0 | 0 | 0 | 0 | KPa |
| 272 | 270 | pressure_coolant_diff | Analog Input | Flow control | 814 | 0 | 5 | 0 | 100 | KPa |
| 220 | 218 | temp_cathode_inlet | Analog Input | Thermal control | 526 | 0 | 1000 | 0 | 100 | ° C. |
| | | temp_cathode_inlet_set | Analog output | Thermal control | 527 | 0 | 1000 | 0 | 100 | ° C. |
| 192 | 156 | flow_cathode_stack_1 | Analog Input | Flow control | 648 | 0 | 20 | 0 | 10 | Slpm |
| | | flow_cathode_stack_1_set | Analog output | Flow control | 649 | 0 | 20 | 0 | 10 | Slpm |
| 234 | 232 | temp_cathode_out | Analog output | Flow control | 544 | 0 | 0 | 0 | 0 | ° C. |
| 246 | 244 | temp_stack_control | Analog Input | Thermal control | 530 | 0 | 1000 | 0 | 100 | ° C. |
| | | temp_stack_control_set | Analog output | Thermal control | 531 | 0 | 1000 | 0 | 100 | ° C. |
| 200 | 198 | signal_out_coolant_heater | Digital output | Flow control | 752 | — | — | — | — | — |
| 210 | 196 | signal_out_coolant_pump | Digital output | Flow control | 751 | — | — | — | — | — |
| 212 | 208 | flow_stack_coolant | Analog Input | Thermal control | 658 | 0 | 500 | 0 | 50 | Lpm |
| | | flow_stack_coolant_set | Analog output | Thermal control | 659 | 0 | 500 | 0 | 50 | Lpm |
| 280a | 116a | data_cell_001 | Analog Input | FCVM(Fuel Cell Voltage Monitor) | 0 | 0 | 5 | 0 | 5 | V |
| 280b | 116b | data_cell_002 | Analog Input | FCVM | 1 | 0 | 5 | 0 | 5 | V |
| 280c | 116c | data_cell_003 | Analog Input | FCVM | 2 | 0 | 5 | 0 | 5 | V |
| 280d | 116d | data_cell_004 | Analog Input | FCVM | 3 | 0 | 5 | 0 | 5 | V |
| 280e | 116e | data_cell_005 | Analog Input | FCVM | 4 | 0 | 5 | 0 | 5 | V |
| 280f | 116f | data_cell_006 | Analog Input | FCVM | 5 | 0 | 5 | 0 | 5 | V |
| 280g | 116g | data_cell_007 | Analog Input | FCVM | 6 | 0 | 5 | 0 | 5 | V |
| 280h | 116h | data_cell_008 | Analog Input | FCVM | 7 | 0 | 5 | 0 | 5 | V |
| 282 | 110 | Lb_DC_volts | Digital value output | Loadbox | 843 | 0 | 1 | 0 | 1 | V |
| 284 | 110 | Lb_AC_Freq | Digital value output | Loadbox | 848 | 0 | 10000 | 0 | 10000 | Hz |
| 286 | 110 | Lb_AC_Volts | Digital value output | Loadbox | 849 | 0 | 1000 | 0 | 1000 | A |
| 288 | 110 | Lb_AC_Amps | Digital value output | Loadbox | 850 | 0 | 1000 | 0 | 1000 | V |

A tag file 310 is stored on a storage device 312 which is accessible to server 300. Tag file 310 contains the information shown in Table 5 for each tag, with the exception of the associated data/control line number and the element number. The use of tag file 310 is explained below.

System manager 306 and driver applications 308 are separate threads of execution (and may be running on the same computer). System manager 306 operates mapped file 302 which contains information relating to every monitorable or controllable element in system 100.

Figure 3:
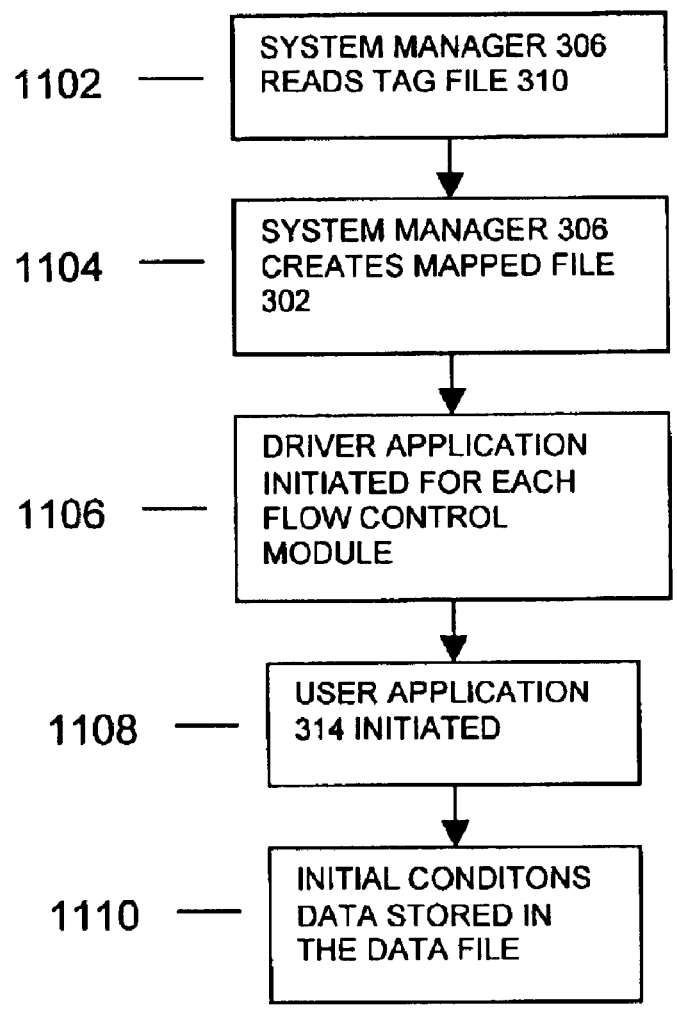
FIG. 3 illustrates a start-up method of a system manager of the control system of FIG. 1.

Reference is next made to FIG. 3, which illustrates a method 1100 by which system manager 306 initiates the operation of system 100.

Method 1100 begins in step 1102 in which system manager 306 reads tag file 310. System manager 306 then creates mapped file 302 in a local memory space in step 1104. Mapped file 302 contains a record for each tag in tagged file 310 containing all of the fields that are in the tagged field, as well as two additional fields:

1. A control/data value field—which contains the current control value for a control tag, or the current data value for a data tag. The values in this field are in the same units as the control/data range for each device.

2. An operating level field—which contains a value corresponding to the control/data value, but in the same units as the operating range for the device.

By way of example, consider the operation of method 1100 relative to tags 576 and 577. In step 1102, system manager 306 reads tag file 310. System manager 306 then creates a mapped file 302 in a local memory space, which mapped file 302 contains a record for tags 576 and 577. This record includes all of the fields for tags 576 and 577 that are in tag file 310, and also includes, for tag 576, a data value field containing the current data value for tag 576, and, for tag 577, a control value field containing the current control value for tag 577. In addition, mapped file 302 contains an operating level field for each of tags 576 and 577, which includes the information stored in the data and control value fields respectively, converted to the same units as the operating range for the device.

Method 1100 then proceeds to step 1106. In step 1106, system manager 306 initiates a driver application for each flow control module. In this embodiment, system manager 306 determines which control modules 304 are present in control system 140 based on the entries in the Module field of the tagged file 310. Alternatively, a list of the control modules 304 may be provided to system manager 306 in a data file, or system manager 306 may analyze the hardware coupled to control system 140 and system 100 to determine which control modules are present.

In this embodiment, four control modules are installed: flow control module 304a, thermal control module 304b, loadbox control module 304c and FCVM control module 304d. In response, system manager 306 initiates four driver applications 308a–308d. Each of these driver applications is an independent thread of execution and operates independently of the others. When initiating each driver application 308, system manager creates the associated message queues (i.e. message queues 316 and 318 for driver application 308a).

System manager 306 then proceeds to step 1108, in which it initiates one or more user applications 314, if any user applications are installed in system 100. The purpose and operation of user applications is discussed below. Such user applications are not part of this first exemplary embodiment of the present invention, although they are included in other embodiment described below. System manager 20 then proceeds to step 1110.

Step 1110 is an optional step which may or may not be included in different embodiments of the present invention. In this step, system manager 306 reads an initial conditions data file (not shown) from a storage device. The initial conditions data file identifies one or more control tags and sets out an initial value for the control tag. For each identified control tag, system manager 306 enters the specified initial value in the control/data value field of the tag's record in the mapped file. System manager 306 then converts the control/data value into the corresponding operating level and stores the result in the operating level field of the tag's record in the mapped file. (Alternatively, the initial value data file may specify a tag's initial operating value and system manager 306 may calculate the corresponding data/control value.)

At the end of step 1110, the initialization operations of system manager 306 are complete. System manager 306 then enters a loop and remains in this loop indefinitely during a fuel cell test. The loop begins in step 1110.

Before describing this loop, it is desirable to explain the purpose and operation of driver applications 308 and user applications 314. Each driver application 308 interfaces with one or more control modules, which provide an interface with the control and data collection devices in system 100.

Each driver application must have access to the relevant tag records in mapped file 302, in which the desired and actual operational conditions of system 100 are recorded.

For example, driver application 308*a* uses flow control module 304*a* to control the operation of flow controller 132*a*, which controls the flow rate of hydrogen into the anode gas mixture manifold 124. Driver application 308*a* can query flow controller 132*a* to determine the current flow rate of hydrogen in anode gas mixture manifold 124. The flow rate reported in response to such a query should be recorded in the control/data value field for the tag flow__anode__mix__H2 (tag No. 576 in Table 5) in mapped file 302. Driver application 308*a* can also instruct flow controller 132*a* to change the flow rate of hydrogen into anode gas mixture manifold 124 to a specified level. This specified level is recorded in the control/data value field for the tag flow__anode__mix__H2__set (tag No. 577 in Table 5) in mapped file 302. Driver application 308*a* can similarly query the operational conditions for all elements of system 100 from which it can receive an input signal (i.e. a digital or analog input) signal and can control the operational settings for any elements to which it can send an output signal.

Each driver application 308 accesses mapped file 302 through system manager 306 by sending messages to and receiving messages from system manager 306 using a pair of message queues. To facilitate this, each driver application uses a method class containing the methods set out in Table 6. Each of the methods transmits a message to system manager 306 and, if appropriate, system manager 306 transmits a return message. The method reads the return message and returns any return values to the driver application.

TABLE 6

Methods in method class accessing mapped file 302

| Method Name | Input Values | Return Values | Operation performed by system manager 306 or by user application 314 | Comments |
|---|---|---|---|---|
| InitializeAndOpen MappedFile | | Handle for mapped filed 302 | Provides handle, which, in turn provides access to mapped file 302 To be used by only the system manager | Allows mapped file 302 to be created and opened with the provided handle. |
| OpenMappedFile | Mapped file name | Handle for mapped filed 302 | Provides read/write access to mapped file | Allows mapped file 302 to be opened |
| CloseMappedFile | Mapped file handle | | Terminates read/write access to mapped file | Allows mapped file 302 to be closed. |
| ReadTaggedValue | Tag number | Current control/data value for tag (first among 5 values) −1 if there is no mapped file available | Provides current control/data value (first among 5 values) for identified tag in mapped file 302. Used by user applications. Applies data conversion. | Returns current specified control value (for a control tag) or currently recorded operating value (for a data tag) for a tag. |
| WriteTaggedValue | Tag number, new control/data value for tag (first among 5 values) | Write confirmation (FALSE if there is no mapped file available, or wrong tag number) | Records new control/data value (first among 5 values) for tag in tag's record in mapped file 302. Used by user applications. Applies data conversion. | Allows new desired control value for a control tag. |
| ReadTaggedValues | Tag number | Pointer to the current control/data values (5 possible values) for each identified tag Returns −1 if there is no mapped file available. | Provides current control/data values (5 values) for the identified tag in the mapped file 302 | Allows reading all the 5 possible current values of the tag. |

TABLE 6-continued

Methods in method class accessing mapped file 302

| Method Name | Input Values | Return Values | Operation performed by system manager 306 or by user application 314 | Comments |
| --- | --- | --- | --- | --- |
| WriteTaggedValues | Tag number, new control/data values (pointer to a 5 elements array) | Write confirmation (FALSE if there is no mapped file available, or wrong tag number) | Records new control/data values (5 possible values) for the identified tag in the mapped file 302 | Allows writing all the 5 possible values of a tag. |
| GetDataArray | Starting tag, number of tags | Pointer to an array containing the current control/data value (first value) for each identified tag | Provides current control/data value (first value) for a number of tags from the mapped file 302 starting with the one mentioned as first | Allows reading the first current value for more than one tag at a time. |
| SetDataArray | Starting tag, number of tags, pointer to an array, containing the current values (first value) of all mentioned tags | Write confirmation (FALSE if there is no mapped file available, or wrong tag specification) | Records current control/data value (first value) for a number of tags of the mapped file 302, starting with the one mentioned as first | Allows writing the first current value for more than one tag at a time. |
| GetTagInfo | Tag number | Pointer to an array containing tag description information | Provides the information describing a tag (tag name, tag type, module, module address, channel number . . . ) | Allows the user application or the drivers to access the tag description. |
| SetTagInfo | Tag number, Pointer to an array containing tag description information | Write confirmation (FALSE if there is no mapped file available, or wrong tag number) | Records changes of the tag description. | Allows changes of the tag description - not recommended to be frequently used. |
| GetTaggedFullValue | Tag number | Control/Data Range High field value for the tag | Provides control/data range high value for tag from tag's record in mapped file 302 | Allows reading tag specific info |
| GetTaggedZeroValue | Tag number | Control/Data Range Low field value for tag | Provides control/data range low value for tag from tag's record in mapped file 302 | Allows reading tag specific info |
| GetTaggedRangeHigh | Tag number | Device Operating Range High for tag | Provides operating range high value for tag from tag's record in mapped file 302 | Allows reading tag specific info |
| GetTaggedRangeLow | Tag number | Device Operating Range High for tag | Provides operating range low value for tag from tag's record in mapped file 302 | Allows reading tag specific info |
| GetTaggedCoefficients | Tag number, pointer to an array of 6 possible integer values | Read confirmation (FALSE if there is no mapped file available, or wrong tag specification) | Provides the value of the 6 calibration coefficients. | Allows reading tag specific info |
| GetTagIndex | Tag name | Tag index, or −1 FALSE if there is no mapped file available, or wrong tag name specification) | Provides the tag number of the named tag | Allows determining the tag number of a named tag. |
| TaskCheckIn | Task name | ID number | Used by user applications and driver applications at start to notify their start and get an ID | Check in procedure to allow the system manager to control the task activity. |
| TaskCheckOut | Task ID | | Used by user applications and driver applications before ending to notify their normal stop. | Check out procedure to allow the tasks to notify the system manager about their normal stop. |

TABLE 6-continued

Methods in method class accessing mapped file 302

| Method Name | Input Values | Return Values | Operation performed by system manager 306 or by user application 314 | Comments |
| --- | --- | --- | --- | --- |
| TaskUpdateTaskActivity | Task ID | | Used by user applications and driver applications to periodically update a designated activity flag | Allows the system manager to periodically notice that the task having the specified ID is still alive. The designated activity flag is cleared by the system manager each checking time. |
| TaskCheckServerActivity | | TRUE if the system manager activity flag is set, FALSE otherwise | Used by user applications and driver applications to periodically check if the system manager is still alive | Allows the user applications and driver applications to periodically check if the system manager is still running. |

Using the methods in the method class set out in Table 6, driver applications 308 are able to read and write control/data values from and to mapped file 302. Typically, driver applications 308 read control values from the records of control tags and write data values into the records of data tags. The control values are used to control the elements of system 100 and the data values report the operational states of the elements of system 100.

User applications 314 are used to define the desired operational state of system 100 during a fuel cell test, or during operation of system 100 at any time, and to report the operational state of system 100 to a user. User applications may be: user interfaces that allow the user to "manually" set the desired operational characteristics of system 100 and that display the current operational state; fully automated software programs that define a fuel cell test and have data recording capabilities for recording the performance of system 100 during the test, a combination of such manual and automated software or other types of program.

User applications 314 provide operating level values for recordal into control tags and read operating level values from data tags for reporting to a user, either through a user interface, data file, both a data file and a user interface or through another reporting device (i.e. a printer), transmitting an e-mail message, wireless pager or other communication device, etc. For control tags, user applications 314 provide operating level values, and the writing method covert them into control value and record them in mapped file. For data tags, the reading methods return the operating level value for the specified tag.

Several user applications 314 are described below in association with other embodiments of the present invention. For the purposes of this embodiment, it suffices that user applications 314 of any nature provide control value and, optionally, read data values from the records of control tags and data tags in mapped file 302.

User applications 314 may access the mapped file 302 in the same way as the driver applications 308: by using the methods in the method class set out in Table 6.

Both user applications and driver applications should access at the start the mapped file in order to apply a "check in" procedure. This procedure consists in specifying its own name and getting back an assigned ID to be used further on to periodically update a designated activity flag—activity update procedure. This procedure serves to have the system manager check if the applications involved in the testing system are "still alive". The user applications can also determine if the system manager is "still alive" by checking its own activity flag. Each application before stopping has to apply a "check out" procedure to let the system manager know that it is not active anymore. Specific methods in the method class set out in Table 6 are used.

The system manager periodically accesses the mapped file to update its own activity flag and check the running user applications and driver applications activity flags, by using the specific methods in the method class set out in Table 6.

Typically, the user application writes control values to the records of control tags and reads data values from the records of data tags. The control values are then read by driver applications 308 to control the components of system 100 through control modules 304. The data values read by user applications 314 from the records of mapped file 302 will typically have been written into the mapped file by driver applications 308a.

System manager 306 requires each driver application 308 to periodically update a designated activity flag in the mapped file. This ensures that a driver application that has stopped executing properly is detected and allows the system manager 306 to take corrective action, which may include stopping and restarting the driver application, terminating any fuel cell test then underway, or taking other action. System manager 306 also requires that all user applications 314 that have applied the check-in procedure to similarly indicate that they are executing properly.

In other embodiments, method 1100 may have additional steps. For example, in some other embodiments, system manager 306 may require each driver application 308 to transmit at least one message within a selected time of its previous message to system manager 306. An additional method to send such an "I'm alive" message may be added to the method class of Table 6 for this purpose. This ensures that a driver application which has stopped executing properly is detected and allows system manager 306 to take corrective action, which may include stopping and restarting the driver application, terminating any fuel cell test then underway, or taking other action. System manager 306 may also require user applications 314 to similarly indicate that they are executing properly.

Driver applications 308 use and update the data recorded in mapped file 302. Each driver application obtains a handle for the mapped file 302 that system manager 306 is using by using the InitializeAndOpenMappedFile method.

Figure 4:
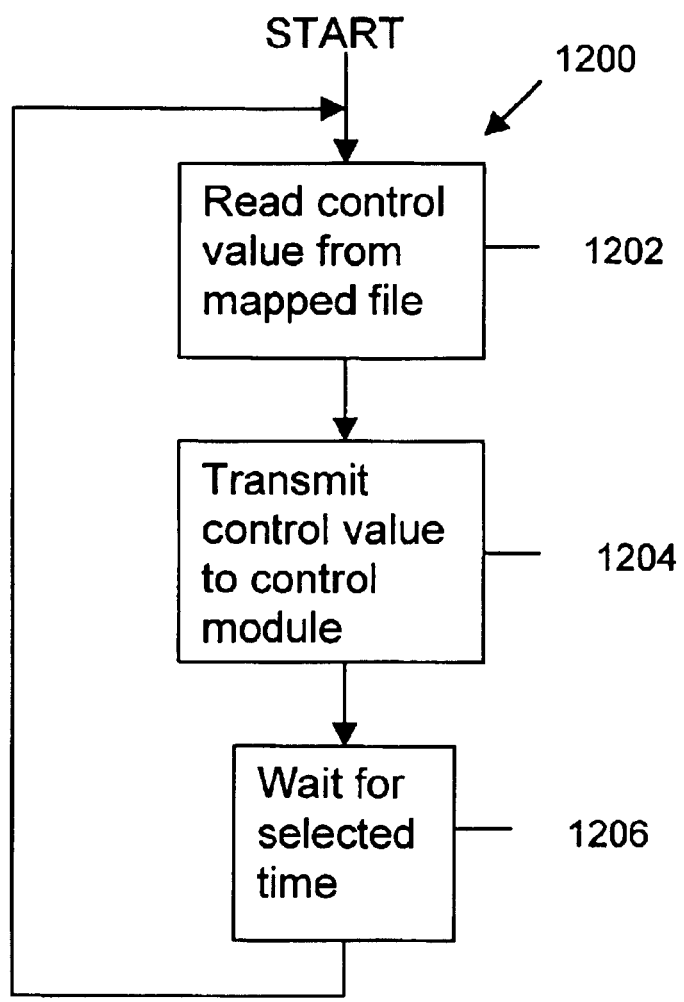
FIG. 4 illustrates a method of operation for driver applications of the control system of FIG. 1.

Reference is next made to FIG. 4, which illustrates a method 1200 by which each driver application 308 controls the element of system corresponding to each tag that the driver application is associated with in Table 5. Each driver application 308 is coupled to a control module to monitor and/or control the operation of at least one element of system 100. Each characteristic that is monitored corresponds to a data tag in the tagged file and in the mapped file 302. Each characteristic that is controlled corresponds to a control tag in the tagged file and in the mapped file 302. The driver application may be said to be associated with each such data and control tag.

Method 1200 is executed by a driver application 308 in respect of each control tag that it is associated with. Method 1200 begins in step 1202, in which the driver application 308 uses the ReadTaggedValue method to obtain the current control value (from the control/data value field of the mapped file) for the control tag. For example, driver application 308a may use the ReadTaggedValue to obtain the current control value for the flow_cathode_stack_1_set tag (tag No. 531 in table 5) to determine what flow rate has been specified for the flow of the cathode gas mixture into the stack (by a user application).

Method 1200 next proceeds to step 1204 in which the driver application transmits the control value for the control tag to its associated control module. Using the example above in step 1202, driver application 308a would transmit the control value to flow control module 304a. Flow control module 304a would then use the control value to control the operation of flow controller 156 by sending control signal on data line 192 (see FIG. 1 and Table 5). The nature of the control signal sent by the control module to the attached element of system 100 will depend on the particular element. For example, a flow controller may be controlled by a high quality PID type feedback control device that monitors and controls the operation of the flow controller constantly to ensure that the flow rate accurately tracks the specified flow rate.

Method 1200 next proceeds to step 1206 in which the driver application waits for a selected time period. The selected time period depends on the particular tag for which method 1200 is being performed. For example, when controlling a flow controller 132 to control the different concentrations of gases in the anode gas mixture, driver application may have a short delay to ensure that changes in the concentrations are processed quickly after they are made by user applications. On the other hand, the delay between iterations of the method 1200 for flow controller 208 may be longer. These comparisons are merely exemplary and in an actual embodiment of the present invention, the delays will be selected based on the type of elements being controlled and the desired degree of precision, as well as the limitations of the associated control module.

After step 1206, method 1200 returns to step 1202.

Figure 5:
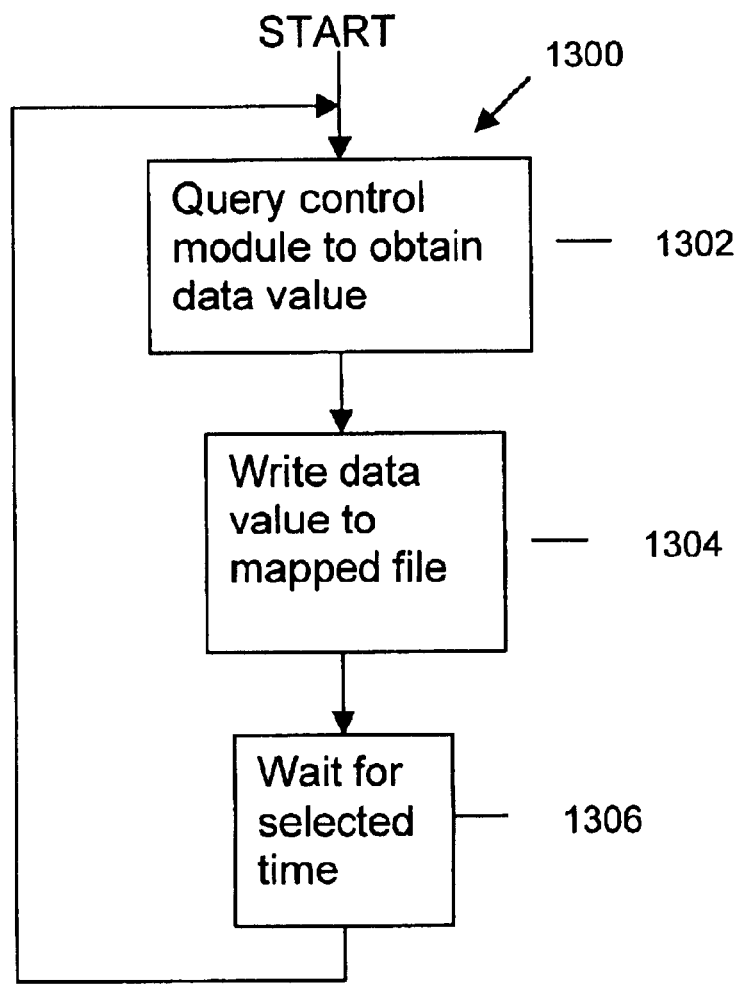
FIG. 5 illustrates another method of operation for driver applications of the control system of FIG. 1; and, FIG. 6, in a block diagram, illustrates a system for creating scripts and programs for use by a user application according to a second embodiment of the present invention.

Reference is next made to FIG. 5, which illustrates a method 1300 by which each driver application 308 monitors the operation of each system element corresponding to each data tag with which the driver application is associated in Table 5. Method 1300 is executed by a driver application 308 in respect of each data tag with which it is associated.

Method 1300 begins in step 1302, in which the driver application 308 queries its associated control module as to the current operating level of the element of system 100 corresponding to the tag for which method 1300 is being performed. For example, driver application 308a may query flow control module 304 to obtain the current flow rate of the cathode gas mixture into the stack 116. This operational level is the data value for the data tag.

Method 1300 next proceeds to step 1304, in which driver application writes the data value to the mapped file record for the tag using the WriteTaggedValue method.

Method 1300 next proceeds to step 1306, in which driver application waits a selected time.

Method 1300 then returns to step 1302.

Using method 1200, each driver application 308 periodically reads the control value for each control tag with which it is associated and transmits the control value to the corresponding element of system 100. Similarly, using method 1300, each driver application 308 periodically obtains the data value for each data tag with which it is associated and stores the data value in the mapped file. Methods 1200 and 1300 are performed simultaneously by each driver application 308 for all control and data tags with which the driver application 308 is associated.

Using these methods, control system 140 controls and monitors each characteristic of each element of system 100 for which a tag has been added to the mapped file. Control system 140 attempts to control system 100 in accordance with the control/data value recorded in the mapped file 302 by a user application. Control system 140 makes the current operational state of the system 100 conform to user applications by updating the data tags in mapped file 302.

Before launching driver applications, the system manager configures them according to the tag file description of the control modules and elements of the current tested system.

Control system 140 has been described in the context of a simplified fuel cell testing system 100. Other embodiments of control system 140 may include data/control lines, tags, control modules and other elements, depending on the structure of the associated fuel cell testing system. Several such variations are described below. A skilled person will be capable of adding control/data lines, tags, control modules and elements to system 100 to accommodate the described variations.

For example, other embodiments of the present invention may include sources of other gases, or may include fewer gases to choose from that may be used to produce the anode gas mixture and/or the cathode gas mixture. Such an embodiment will include corresponding control/data lines to control the flow of such gases, tag lines and entries in the mapped file.

According to different embodiments of the present invention, the stack may include any number of fuel cells. The corresponding control system will include corresponding control/data lines to monitor the voltage across each cell in the stack.

Other embodiments of the invention may include controlling and monitoring the environment chamber in which the fuel cell stack is situated during a fuel cell test. For example, the humidity and temperature of the environment chamber may be controlled. Such embodiments will include control tags in the mapped file for control values associated with the temperature and humidity as well as corresponding data tags for monitoring the temperature and humidity. A skilled person will be capable of providing the appropriate data and control lines for such an embodiment.

Other embodiments of the invention may include data tags for monitoring the coolant fluid as well as the anode and cathode mixtures. Such data tags will be associated with appropriate data lines coupled to two sensors in the fuel cell testing system.

Other embodiments may include valves and full meters as well as pressure sensors for controlling and monitoring the main gas supply as well as the gas exhaust outlets. Such systems will include appropriate control and data tanks as well as the appropriate control and data lines in associated hardware within the fuel cell testing system.

The foregoing characteristics are only a sample of the test conditions that may need to be controlled during the testing of a particular fuel cell for a particular purpose. The present invention provides a software system for controlling system 100 to regulate these conditions, as well as other conditions, based on the particular of the fuel cell testing system with which the present invention is used.

Figure 6:
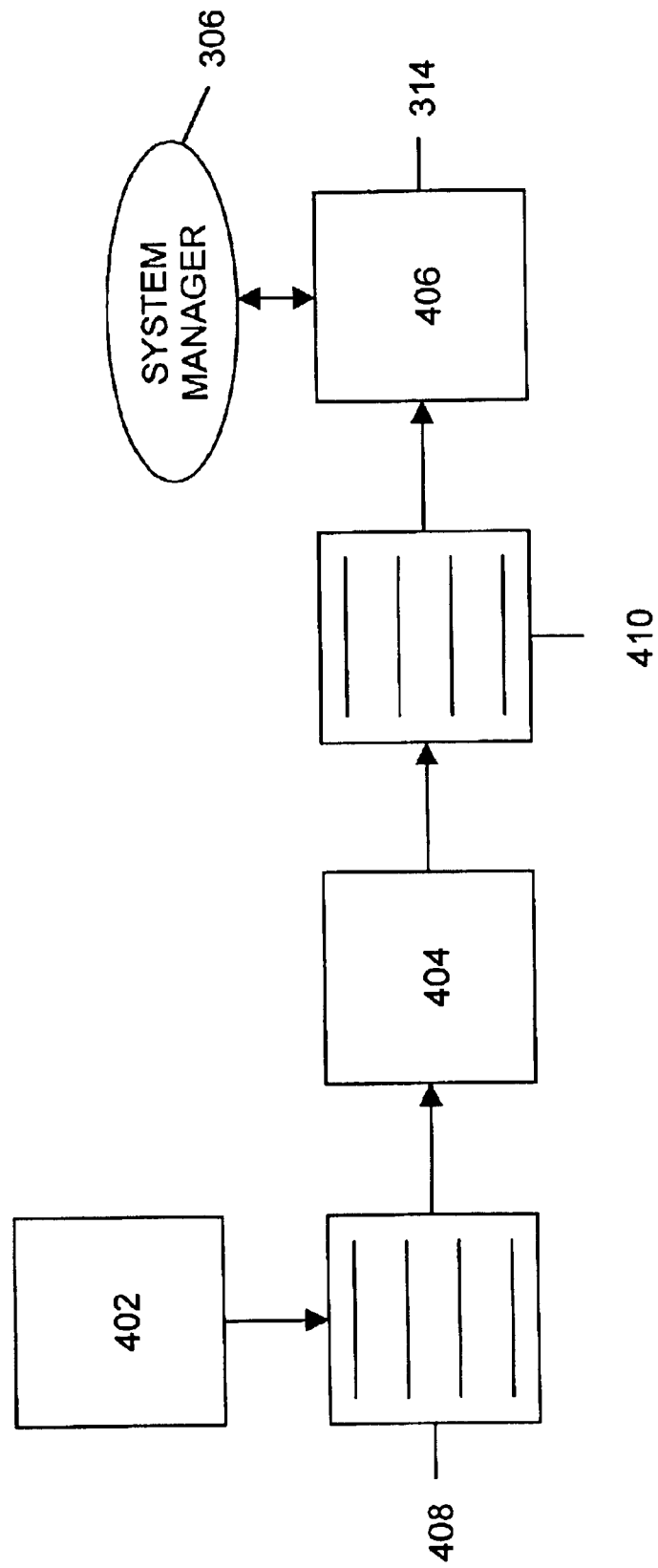

Reference is made to FIG. 6. A second exemplary embodiment of the present invention will now be described. The second embodiment is identical in structure to the first exemplary embodiment described above with the addition of system 400 for creating user applications. System 400 includes a scripting language 402, a script compiler 404 and a program processor 406. Program processor 406 is a user application 314 (See FIG. 2).

Scripting language 402 is used to create scripts 408 for conducting fuel cell tests using system 100 (FIG. 1). Scripting language 402 has a number of commands, which are set out in Tables 7–11. Scripts 408 are converted into programs 410 using script compiler 404. While doing so, script compiler 404 checks the syntax and flow of the script 408 to ensure that an executable program 410 can be assembled. Executable programs 410 are used by program processor 406 to communicate with system manager 306 to control a fuel cell test.

Table 7 describes a set of setpoint commands which are used in a script to set the desired operating level for a device associated with a control tag. The parameters for each setpoint command are described in Table 7.

TABLE 7

Setpoint Commands

| Command | Parameters | Description |
| --- | --- | --- |
| Set_flow | Tag#, Flow, Ramp | Valid only for control tags for flow controllers. The flow rate of the specified flow controller (based on the tag#) is changed to the specified flow rate. The flow rate is changed at the ramp rate. For example, if the tag No. = 583, Flow = 200 and Ramp = 25, then the flow rate of flow controller 132d is changed from its current flow rate to 200 slpm at a change of 25 slpm/second (or other selected time period). |
| Set_stoich | Tag# and stoichiometric ratio | Helps to control the gas flow. That is, the gas flow is calculated using stoich and load current. |
| Set_load | Tag#, characteristic, Ramp | Valid only for loadbox tags. Characteristic may be set out in volts (DC or AC volts), Hz (AC frequency) or amps (AC current). Ramp defines the rate of change of the characteristic from the current control value |
| Set_temperatue | Tag#, Temp, Ramp | Valid only for control tags for temperature controls (i e. heaters, coolers, etc.) The temp parameter defines the new target temperature and the ramp field defines the desired rate of change from the old target temperature to the new target temperature |
| Set_pressure | Tag#, Pressure, Ramp | Valid only for control tags for pressure controls. A pressure controller (not shown) provides distributed pressure control via individual pressure control devices (not shown) distributed in the fuel cell testing system. |
| Set_equivalent_flow | Tag#, Flow and Ramp | Used for the calculation of flow. It calculates the proper gas flow setpoint according to the load current and the stoich. |
| Get_tag_value | Tag#, Value | This command is used to read tags. |

Table 8 describes a series of commands that apply to system 100, including control system 140.

TABLE 8

Test System Action Commands

| Command | Description |
| --- | --- |
| Start_averaging | In some embodiments of the present invention, control system 140 is configured to average the operating level field for all data tags defined in the map file. This command initiates this averaging operation. |
| Stop_averaging | This command terminates the averaging operation. The results of the averaging operation are recorded in a log file. Alternatively, the record for each data tag in the mapped file may include an "Average value" field, in which the average operating level during the last averaging operation is stored. |
| Enable_safeties | Tells system to conduct safety check. |
| Override_safeties | Overrides instructions to conduct safety check. |
| E_stop | Emergency stop of test. |
| Clear_alarms | Clears alarm messages. |
| Log_data_now | The records of all tags in the mapped file are recorded in a log file. |
| Log_data_subset | The records of a set of tags previously associated with the subset_no is added to a log file. |
| Start_new_datafile | The log file used for the Log_data_now and Log_data_subset commands is closed and a new datafile is opened. |
| Autologging_ON | Automatic logging of changes in tag records in the mapped file to the log file is turned on. |
| Autologging_OFF | Automatic logging of changes in tag records to the log file is turned off. |
| Voltage_control_mode | The loadbox has three operation modes: a constant current mode, a constant voltage mode and a constant power mode. These two commands are used to switch the loadbox between these modes of operation. |
| Current_control_mode | The loadbox has three operation modes: a constant current mode, a constant voltage mode and a constant power mode. These two commands are used to switch the loadbox between these modes of operation. |

Table 9 describes a set of program flow commands that may be used to control the execution flow of a script.

TABLE 9

Program Flow Commands

| Command | Parameters | Description |
|---|---|---|
| If | Tag, Condition | Allow a command or block to be executed only if the operational level of a tag (which may be a control or data tag) meets a condition |
| AndIf | Tag, Condition | Allows a second mandatory If condition to be added to an If command |
| OrIf | Tag, Condition | Allows an alternative If condition to be added to an If command |
| Wait_Until | Tag, Condition | Delays execution of the script until the operating level of a tag meets a condition |
| Delay | Time | Delays execution of the script for the specified time |
| Verify_Safeties | | Insures the test is in good condition, and is ready to proceed to the next test stop. |
| Else | | Allows a command or block to be defined for execution if the condition of an If command was not true. |
| EndIf | | Ends a block of commands executed in response to an If command. |

Table 10 defines a set of block commands that may be used to define a block of commands. A block of commands are executed as a whole in response to an If, ElseIf, Wait_Until or other program flow commands.

TABLE 10

Block Commands

| Command | Parameters | Description |
|---|---|---|
| BeginBlock | | Defines the beginning of a block of commands |
| EndBlock | | Defines the end of a block of commands |
| ExitBlock | | Used within a block of commands. Moves execution to the first instruction after the end of the block |
| Include | Filename | Causes the identified file to be read from a storage device and treated as if it was literally inserted in place of the command. |

Table 11 defines a set of documentation commands that allows comments to be inserted into a script without affecting the execution of the script.

TABLE 11

Documentation Commands

| Command | Parameters | Description |
|---|---|---|
| Rem | | Placed at the beginning of a line in a script. It results in the entire line being ignored by the script compiler 404 |
| ; | | Placed after another command in a line of a script. It causes the script compiler 404 to ignore the rest of the line, including the ; command itself. |
| Print | String | Causes the string to be displayed on an output device (such as a printer or display screen). |
| Write_comment | String | Causes the entire mapped file to be recorded in a log file and identified with the string. |
| Display | Tag# | Causes the operating level of the tag to be displayed |

As is well known, the script can be constructed using an automated program for making the script. A user can select a command and then the automated program will give a list of possible parameters and other information from which to choose. This helps to ensure that the command syntax is correct. Also, loops can be put in the script and can be repeat loops. Modification to the script can be made when the script is running, and there is no need to shut down or reload a script. When a sub-script is called, a new window will come up. When a test experiences alarm conditions, an alarm recovery script will automatically be activated.

Other variations and modifications of the invention are possible. All such modifications or variations are believed to be within the scope of the claims as appended hereto.

What is claimed is:

1. A system for testing a fuel cell, the system comprising:
a) testing means for controlling a controllable condition of the fuel cell during testing based on a control value, and for measuring a measurable condition of the fuel cell during testing to provide a data value;
b) a control system for sending the control value to the testing means and for receiving the data value from the testing means;

c) a system manager for sending the control value to the control system, and for receiving the data value from the control system, the system manager being connected to the control system and comprising
(i) user interface means for receiving a user-readable input value and for providing a user-readable output value,
(ii) conversion means for converting the user-readable input value to the control value and for converting the data value to the user-readable output value, and,
(iii) mapped file generation means for generating a mapped file, wherein the mapped file comprises a plurality of tag records, the plurality of tag records including a control tag record for storing the control value and a data tag record for storing the data value; and, d) a storage means for storing the mapped file.

2. The system as defined in claim 1 wherein
the testing means is operable to control a plurality of the controllable conditions of the fuel cell during testing based on a plurality of the control values, and is operable to measure a plurality of the measurable conditions of the fuel cell during testing to provide a plurality of the data values;
the conversion means is operable to convert a plurality of the user-readable input values to the plurality of control values, and to convert the plurality of the data values to a plurality of the user-readable output values,
the plurality of tag records comprises
a plurality of the control tag records including an associated control tag record for each control value in the plurality of control values, and
a plurality of the data tag records including an associated data tag record for each data value in the plurality of data values.

3. The system as defined in claim 2 wherein
the plurality of control values comprises an anode flow control value and a cathode flow control value;
the testing means comprises a flow control module for controlling flow of an anode gas mixture based on the anode flow control value, and for controlling flow of a cathode gas mixture based on the cathode flow control value, and
the plurality of user-readable input values comprises an anode flow input value for conversion to provide the anode flow control value and a cathode flow input value for conversion to provide the cathode flow control value.

4. The system as defined in claim 2 wherein
the plurality of control values comprises a load control value;
the testing means comprises a load control module for controlling a current load drawn from the fuel cell; and,
the plurality of user-readable input values comprises a load input value for conversion to provide the load control value.

5. The system as defined in claim 2 wherein
for each control value in the plurality of control values, the associated control tag record comprises
a control range low field for storing a lowest possible control value,
a control range high field for storing a highest possible control value,
a device range low field for storing a lowest possible user-readable input value, and,
a device range high field for storing a highest possible user-readable input value;
for each data value in the plurality of data values, the associated data tag record comprises
a data range low field for storing a lowest possible data value,
a data range high field for storing a highest possible data value,
a device range low field for storing a lowest possible user-readable output value, and,
a device range high field for storing a highest possible user-readable output value; and,
the conversion means is operable
to convert each user-readable input value in the plurality of the user-readable input values to an associated control value in the plurality of control values based on the lowest possible control value, highest possible control value, lowest possible user-readable input value, and highest possible user-readable input value stored in the associated control tag record, and
to convert each data value in the plurality of data values to an associated user-readable output value in the plurality of the user-readable output values based on the lowest possible data value, highest possible data value, lowest possible user-readable output value, and highest possible user-readable output value stored in the associated data tag record.

6. The system as defined in claim 2 wherein the conversion means is operable
to convert each user-readable input value in the plurality of the user-readable input values to an associated control value in the plurality of control values based on associated control conversion information stored in the associated control tag record, and
to convert each data value in the plurality of data values to an associated user-readable output value in the plurality of the user-readable output values based on associated data conversion information stored in the associated data tag record.

7. The system as defined in claim 3 wherein
the testing means comprises
an anode gas mixing manifold for mixing a plurality of anode gases to provide the anode gas mixture,
a plurality of anode gas sources for supplying the plurality of anode gases to the anode gas mixing manifold,
a cathode gas mixing manifold for mixing a plurality of cathode gases to provide the cathode gas mixture, and
a plurality of cathode gas sources for supplying the plurality of cathode gases to the cathode gas mixing manifold;
the plurality of control values comprises
a plurality of the anode flow control values including an associated anode control value for each anode gas in the plurality of anode gases, and
a plurality of the cathode flow control values including an associated cathode control value for each cathode gas in the plurality of cathode gases;
the plurality of user-readable input values comprises
a plurality of the anode flow input values for conversion to provide the plurality of anode flow control values, and
a plurality of cathode flow input values for conversion to provide the plurality of cathode flow control values; and, the flow control module is operable to control flow of each anode gas based on the associated anode control value, and to control flow of each cathode gas based on the associated cathode control value.

8. The system as defined in claim 3 wherein the control system comprises a tag file, the tag file being readable by the system manager to generate the mapped file.

9. The system as defined in claim 3 wherein the plurality of control values comprises an anode temperature control value and a cathode temperature control value;

the plurality of data values comprises an anode temperature data value and a cathode temperature data value;

the testing means comprises temperature control means for controlling an anode gas mixture temperature based on the anode temperature control value, and for controlling a cathode gas mixture temperature based on the cathode temperature control value, and temperature measuring means for measuring the anode gas mixture temperature to provide the anode temperature data variable, and for measuring the cathode gas mixture temperature to provide the cathode temperature data variable;

the plurality of user-readable input values comprises an anode temperature input value for conversion to provide the anode temperature control value, and a cathode temperature input value for conversion to provide the cathode temperature control value; and, the plurality of user-readable output values comprises an anode temperature output value determined by the conversion means from the anode temperature data value, and a cathode temperature output value determined by the conversion means from the cathode temperature data value.

10. The system as defined in claim 3 wherein the plurality of control values comprises an anode humidity control value and a cathode humidity control value;

the testing means comprises humidity control means for controlling an anode gas mixture humidity based on the anode humidity control variable, and for controlling a cathode gas mixture humidity based on the cathode humidity control variable; and, the plurality of user-readable input values comprises an anode humidity input value for conversion to provide the anode humidity control value, and a cathode humidity input value for conversion to provide the cathode humidity control value.

11. The system as defined in claim 8 wherein for each control value in the plurality of control values, the associated control tag record comprises a control value field for recording the control value, and for each data value in the plurality of data values, the associated data tag record comprises a data value field for recording the data value.

12. A method, in a data processor, for controlling a plurality of controllable conditions of a fuel cell and for measuring a plurality of measurable conditions of the fuel cell, the method comprising:

a) entering a user-readable input value into the data processor;

b) converting the user-readable input value to an associated control value;

c) controlling an associated controllable condition based on the associated control value for the user-readable input value;

d) measuring a selected measurable condition in the plurality of measurable conditions to obtain an associated data value;

e) converting the associated data value to a user-readable output value;

f) displaying the user-readable output value; and, g) generating a mapped file in a storage means accessible to the data processor, wherein the mapped file comprises a plurality of tag records including a control tag record storing the associated control value and a data tag record for storing the associated data value.

13. The method as defined in claim 12 wherein step (a) comprises entering a plurality of the user-readable input values into the data processor;

step (b) comprises converting each user-readable input value in the plurality of user-readable input values to an associated control value to generate a plurality of control values;

step (c) comprises, for each user-readable input value in the plurality of user-readable input values, controlling the associated controllable condition based on the associated control value for the user-readable input value;

step (d) comprises measuring the plurality of measurable conditions to obtain an associated data value for each measurable condition in the plurality of measurable conditions;

step (e) comprises, for each user-readable input value in the plurality of user-readable input values, converting the associated data value to a user-readable output value to generate a plurality of user-readable output values; and, step (f) comprises displaying the plurality of user-readable output values;

wherein the plurality of tag records comprises a plurality of the control tag records including an associated control tag record for each control value in the plurality of control values, and a plurality of the data tag records including an associated data tag record for each data value in the plurality of data values.

14. A method as defined in claim 13 wherein the plurality of control values comprises an anode flow control value and a cathode flow control value;

the plurality of user-readable input values comprises an anode flow input value and a cathode flow input value;

step (a) comprises entering the anode flow input value and the cathode flow input value;

step (b) comprises converting the anode flow input value to the anode flow control value and converting the cathode flow input value to the cathode flow control value;

step (c) comprises controlling flow of an anode gas mixture based on the anode flow control value, and controlling flow of a cathode gas mixture based on the cathode flow control value.

15. A method as defined in claim 13 wherein the plurality of control values comprises a load control value;

the plurality of user-readable input values comprises a load input value;

step (a) comprises entering the load input value;

step (b) comprises converting the load input value to the load control value; and, step (c) comprises controlling a load drawn from the fuel cell based on the load control value.

16. The method as defined in claim 13 wherein
the plurality of control values comprises an anode temperature control value and a cathode temperature control value;
the plurality of data values comprises an anode temperature data value and a cathode temperature data value;
step (a) comprises entering an anode temperature input value and a cathode temperature input value into the data processor;
step (b) comprises converting the anode temperature input value to an anode temperature control value, and converting the cathode temperature input value to a cathode temperature control value
step (c) comprises controlling an anode gas mixture temperature based on the anode temperature control variable, and controlling a cathode gas mixture temperature based on the cathode temperature control variable, and
step (d) comprises measuring the anode gas mixture temperature to provide the anode temperature data variable, and measuring the cathode gas mixture temperature to provide the cathode temperature data variable; and,
step (e) comprises converting the anode temperature data value to an anode temperature output value, and converting the cathode temperature data value to a cathode temperature output value; and,
step (f) comprises displaying the anode temperature output value, and the cathode temperature output value.

17. The method as defined in claim 13 wherein
the plurality of control values comprises an anode humidity control value and a cathode humidity control value;
step (a) comprises entering an anode humidity input value and a cathode humidity input value into the data processor;
step (b) comprises converting the anode humidity input value to an anode humidity control value, and converting the cathode humidity input value to a cathode humidity control value; and,
step (c) comprises controlling an anode gas mixture humidity based on the anode humidity control value, and controlling a cathode gas mixture humidity based on the cathode humidity control value.

18. The method as defined in claim 13 wherein
for each control value in the plurality of control values, the associated control tag record comprises
a control range low field for storing a lowest possible control value,
a control range high field for storing a highest possible control value,
a device range low field for storing a lowest possible user-readable input value, and,
a device range high field for storing a highest possible user-readable input value;
for each data value in the plurality of data values, the associated data tag record comprises
a data range low field for storing a lowest possible data value,
a data range high field for storing a highest possible data value,
a device range low field for storing a lowest possible user-readable output value, and,
a device range high field for storing a highest possible user-readable output value;
step (b) comprises converting each user-readable input value in the plurality of user-readable input values to the associated control value based on the lowest possible control value, highest possible control value, lowest possible user-readable input value, and highest possible user-readable input value stored in the associated control tag record; and
step (e) comprises converting each data value in the plurality of data values to the associated user-readable output value in the plurality of the user-readable output values based on the lowest possible data value, highest possible data value, lowest possible user-readable output value, and highest possible user-readable output value stored in the associated data tag record.

19. The method as defined in claim 13 wherein
step (b) comprises converting each user-readable input value in the plurality of user-readable input values to the associated control value based on associated control conversion information stored in the associated control tag record, and
step (e) comprises converting each data value in the plurality of data values to the associated user-readable output value in the plurality of the user-readable output values based on associated data conversion information stored in the associated data tag record.

20. The method as defined in claim 14 further comprising
for each control value in the plurality of control values, recording the control value in a control value field of the associated control tag record;
for each data value in the plurality of data values, recording an associated current data value of the data value in a data value field of the associated data tag record.

21. A computer program product for use on a fuel cell testing system including a data processor to control a plurality of controllable conditions of a fuel cell and to measure a plurality of measurable conditions of the fuel cell, the computer program product comprising:
a recording medium;
means recorded on the medium for instructing the data processor to perform the steps of:
(a) converting a user-readable input value to an associated control value;
(b) controlling an associated controllable condition based on the associated control value for the user-readable input value;
(c) measuring a selected measurable condition in the plurality of measurable conditions to obtain an associated data value;
(d) converting the associated data value to a user-readable output value;
(e) displaying the user-readable output value; and,
(f) generating a mapped file in a storage means accessible to the data processor, wherein the mapped file comprises a plurality of tag records including a control tag record for storing the associated control value in a data tag record for storing the associated data value.

22. The computer program product as defined in claim 21 wherein
step (a) comprises entering a plurality of the user-readable input values into the data processor;
step (b) comprises converting each user-readable input value in the plurality of user-readable input values to an associated control value to generate a plurality of control values;
step (c) comprises, for each user-readable input value in the plurality of user-readable input values, controlling the associated controllable condition based on the associated control value for the user-readable input value;

step (d) comprises measuring the plurality of measurable conditions to obtain an associated data value for each measurable condition in the plurality of measurable conditions;

step (e) comprises, for each user-readable input value in the plurality of user-readable input values, converting the associated data value to a user-readable output value to generate a plurality of user-readable output values;

step (f) comprises displaying the plurality of user-readable output values; and, wherein the plurality of tag records comprises
a plurality of the control tag records including an associated control tag record for each control value in the plurality of control values, and
a plurality of the data tag records including an associated data tag record for each data value in the plurality of data values.

23. A computer program product as defined in claim 22 wherein
the plurality of control values comprises an anode flow control value and a cathode flow control value;
the plurality of user-readable input values comprises an anode flow input value and a cathode flow input value;
step (a) comprises entering the anode flow input value and the cathode flow input value;
step (b) comprises converting the anode flow input value to the anode flow control value and converting the cathode flow input value to the cathode flow control value;
step (c) comprises controlling flow of an anode gas mixture based on the anode flow control value, and controlling flow of a cathode gas mixture based on the cathode flow control value.

24. A computer program product as defined in claim 22 wherein
the plurality of control values comprises a load control value;
the plurality of user-readable input values comprises a load input value;
step (a) comprises entering the load input value;
step (b) comprises converting the load input value to the load control value; and,
step (c) comprises controlling a current load drawn from the fuel cell based on the load control value.

25. The computer program product as defined in claim 22 wherein
the plurality of control values comprises an anode temperature control value and a cathode temperature control value;
the plurality of data values comprises an anode temperature data value and a cathode temperature data value;
step (a) comprises entering an anode temperature input value and a cathode temperature input value into the data processor;
step (b) comprises converting the anode temperature input value to an anode temperature control value, and converting the cathode temperature input value to a cathode temperature control value;
step (c) comprises controlling an anode gas mixture temperature based on the anode temperature control variable, and controlling a cathode gas mixture temperature based on the cathode temperature control variable, and step (d) comprises measuring the anode gas mixture temperature to provide the anode temperature data variable, and measuring the cathode gas mixture temperature to provide the cathode temperature data variable; and, step (e) comprises converting the anode temperature data value to an anode temperature output value, and converting the cathode temperature data value to a cathode temperature output value; and, step (f) comprises displaying the anode temperature output value, and the cathode temperature output value.

26. The computer program product as defined in claim 22 wherein
the plurality of control values comprises an anode humidity control value and a cathode humidity control value;
step (a) comprises entering an anode humidity input value and a cathode humidity input value into the data processor;
step (b) comprises converting the anode humidity input value to an anode humidity control value, and converting the cathode humidity input value to a cathode humidity control value; and,
step (c) comprises controlling an anode gas mixture humidity based on the anode humidity control value, and controlling a cathode gas mixture humidity based on the cathode humidity control value.

27. The computer program product as defined in claim 22 wherein
for each control value in the plurality of control values, the associated control tag record comprises
a control range low field for storing a lowest possible control value,
a control range high field for storing a highest possible control value,
a device range low field for storing a lowest possible user-readable input value, and,
a device range high field for storing a highest possible user-readable input value;
for each data value in the plurality of data values, the associated data tag record comprises
a data range low field for storing a lowest possible data value,
a data range high field for storing a highest possible data value,
a device range low field for storing a lowest possible user-readable output value, and,
a device range high field for storing a highest possible user-readable output value;
step (b) comprises converting each user-readable input value in the plurality of user-readable input values to the associated control value based on the lowest possible control value, highest possible control value, lowest possible user-readable input value, and highest possible user-readable input value stored in the associated control tag record; and,
step (e) comprises converting each data value in the plurality of data values to the associated user-readable output value in the plurality of the user-readable output values based on the lowest possible data value, highest possible data value, lowest possible user-readable output value, and highest possible user-readable output value stored in the associated data tag record.

28. The computer program product as defined in claim 22 wherein
- step (b) comprises converting each user-readable input value in the plurality of user-readable input values to the associated control value based on associated control conversion information stored in the associated control tag record, and
- step (e) comprises converting each data value in the plurality of data values to the associated user-readable output value in the plurality of the user-readable output values based on associated data conversion information stored in the associated data tag record.

29. The computer program product as defined in claim 23 wherein the means recorded on the medium is operable to instruct the data processor to perform the steps of
- for each control value in the plurality of control values, recording the control value in a control value field of the associated control tag record; and
- for each data value in the plurality of data values, recording an associated current data value of the data value in a data value field of the associated data tag record.

* * * * *